(12) United States Patent
Cheng et al.

(10) Patent No.: US 10,522,476 B2
(45) Date of Patent: Dec. 31, 2019

(54) PACKAGE STRUCTURE, INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Li-Hui Cheng, New Taipei (TW); Jing-Cheng Lin, Hsinchu (TW); Po-Hao Tsai, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/652,247

(22) Filed: Jul. 18, 2017

(65) Prior Publication Data

US 2019/0027446 A1    Jan. 24, 2019

(51) Int. Cl.
*H01L 23/00*    (2006.01)
*H01L 23/538*    (2006.01)
(Continued)

(52) U.S. Cl.
CPC .......... *H01L 23/562* (2013.01); *H01L 21/486* (2013.01); *H01L 21/4853* (2013.01);
(Continued)

(58) Field of Classification Search
CPC . H01L 23/562; H01L 21/4853; H01L 21/568; H01L 21/565; H01L 21/4857;
(Continued)

(56) References Cited

U.S. PATENT DOCUMENTS 6,353,267 B1 * 3/2002 Ohuchi ............... H01L 21/6836
257/690
9,000,584 B2    4/2015 Lin et al.
(Continued)

OTHER PUBLICATIONS

Brenner, "Use Underfill Encapsulants to Enhance Flip-Chip Assembly Reliability", Jul. 30, 2012,Source URL: http://www.electronicdesign.com/boards/use-underfill-encapsulants-enhance-flip-chip-assemblyreliability, pp. 1/8-8/8.*

*Primary Examiner* — Steven H Loke
*Assistant Examiner* — Juanita B Rhodes
(74) *Attorney, Agent, or Firm* — JCIPRNET

(57) ABSTRACT

A package structure including an integrated fan-out package and plurality of conductive terminals is provided. The integrated fan-out package includes an integrated circuit component, a plurality of conductive through vias, an insulating encapsulation having a first surface and a second surface opposite to the first surface, and a redistribution circuit structure. The insulating encapsulation laterally encapsulates the conductive through vias and the integrated circuit component. Each of conductive through vias includes a protruding portion accessibly revealed by the insulating encapsulation. The redistribution circuit structure is electrically connected to the integrated circuit component and covers the first surface of the insulating encapsulation and the integrated circuit component. The conductive terminals are disposed on and electrically connected to the protruding portions of the conductive through vias, and a plurality of intermetallic compound caps are formed between the conductive terminals and the protruding portions.

20 Claims, 19 Drawing Sheets

(51) Int. Cl.
*H01L 23/31* (2006.01)
*H01L 21/48* (2006.01)
*H01L 21/56* (2006.01)
*H01L 25/00* (2006.01)
*H01L 23/498* (2006.01)
*H01L 25/10* (2006.01)
*H01L 21/683* (2006.01)
*H01L 23/50* (2006.01)

(52) U.S. Cl.
CPC ........ *H01L 21/4857* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 23/5383* (2013.01); *H01L 23/5384* (2013.01); *H01L 23/5386* (2013.01); *H01L 23/5389* (2013.01); *H01L 25/105* (2013.01); *H01L 25/50* (2013.01); *H01L 23/49816* (2013.01); *H01L 23/50* (2013.01); *H01L 2221/68345* (2013.01); *H01L 2221/68359* (2013.01); *H01L 2224/18* (2013.01); *H01L 2224/48091* (2013.01); *H01L 2225/1035* (2013.01); *H01L 2225/1058* (2013.01)

(58) Field of Classification Search
CPC ..... H01L 21/486; H01L 25/50; H01L 25/105; H01L 23/3114; H01L 23/5383; H01L 23/5386; H01L 23/5384; H01L 23/5389; H01L 2225/1035; H01L 2225/1058; H01L 23/3128; H01L 2224/18; H01L 21/6835; H01L 2221/68345; H01L 2221/68359; H01L 2224/48091; H01L 23/49816; H01L 23/50; H01L 24/43; H01L 23/535; H01L 23/31; H01L 21/56
See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0037169 A1* | 2/2011 | Pagaila ............... H01L 21/561 257/737 |
| 2012/0228780 A1* | 9/2012 | Kim .................... H01L 23/36 257/774 |
| 2014/0008821 A1* | 1/2014 | Toyoda ................ H01L 24/97 257/792 |
| 2014/0210101 A1* | 7/2014 | Lin ..................... H01L 24/19 257/774 |
| 2014/0252646 A1* | 9/2014 | Hung .................. H01L 23/481 257/774 |
| 2015/0179591 A1* | 6/2015 | Tsai .................... H01L 21/486 257/774 |
| 2017/0084596 A1* | 3/2017 | Scanlan ............... H01L 25/50 |

* cited by examiner

PACKAGE STRUCTURE, INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, some package-on-package (POP) structures including an integrated fan-out package and at least one memory device stacked over the integrated fan-out package are developed and are becoming increasingly popular for their compactness. In the currently available POP structures, delamination issue may occur at the joint between the integrated fan-out package and the memory device. How to eliminate the delamination issue occurred at the joint between the integrated fan-out package and the memory device is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
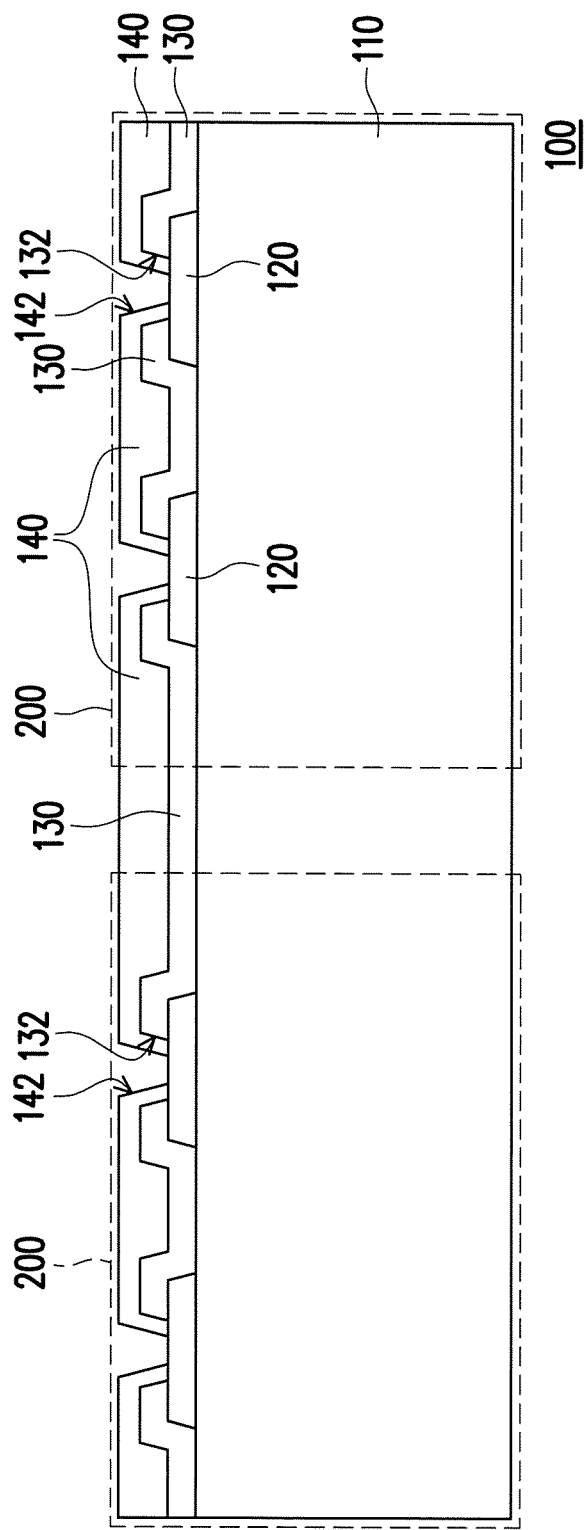
FIGS. 1 through 14 illustrate a process flow for fabricating a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 14:
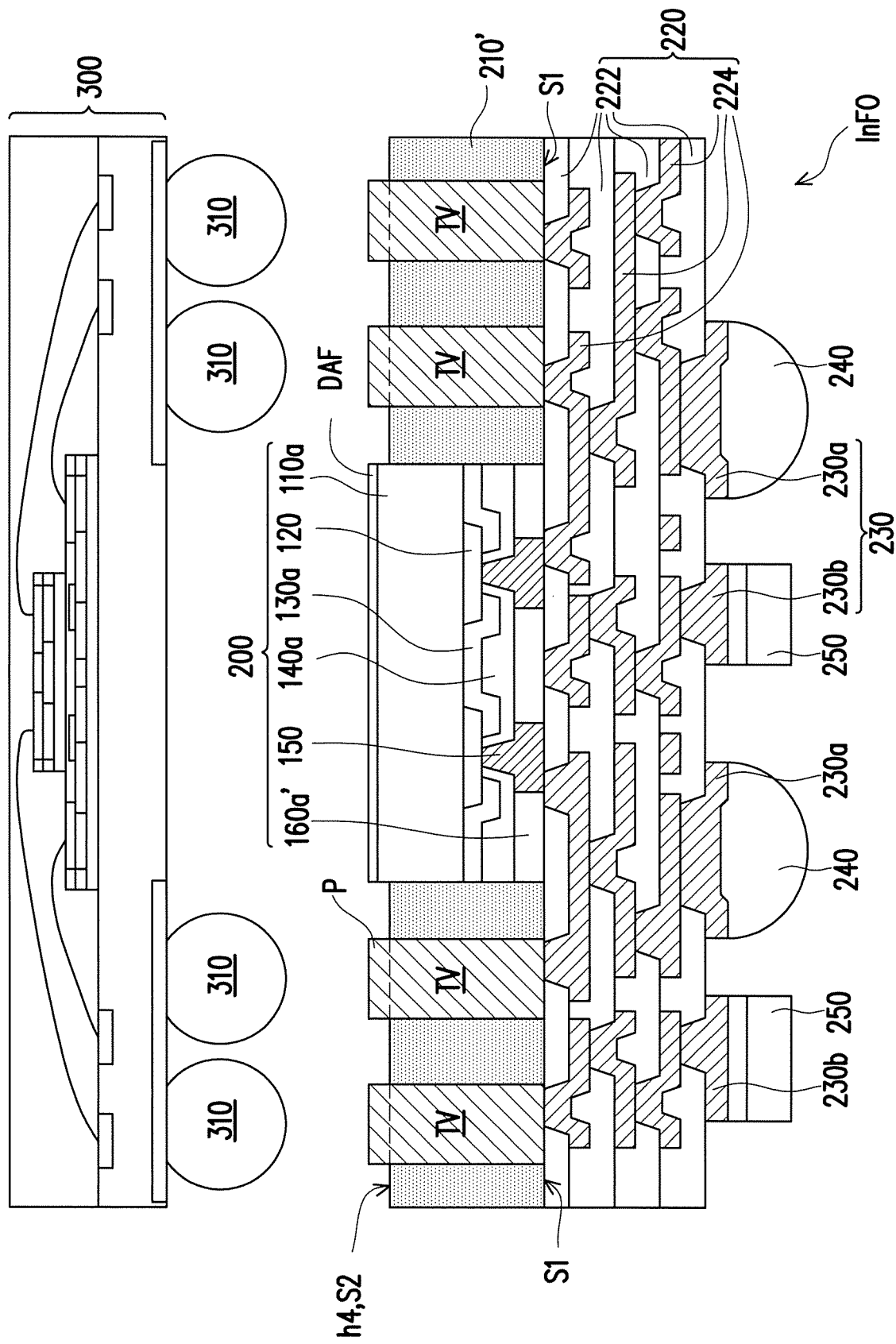
Figure 15:
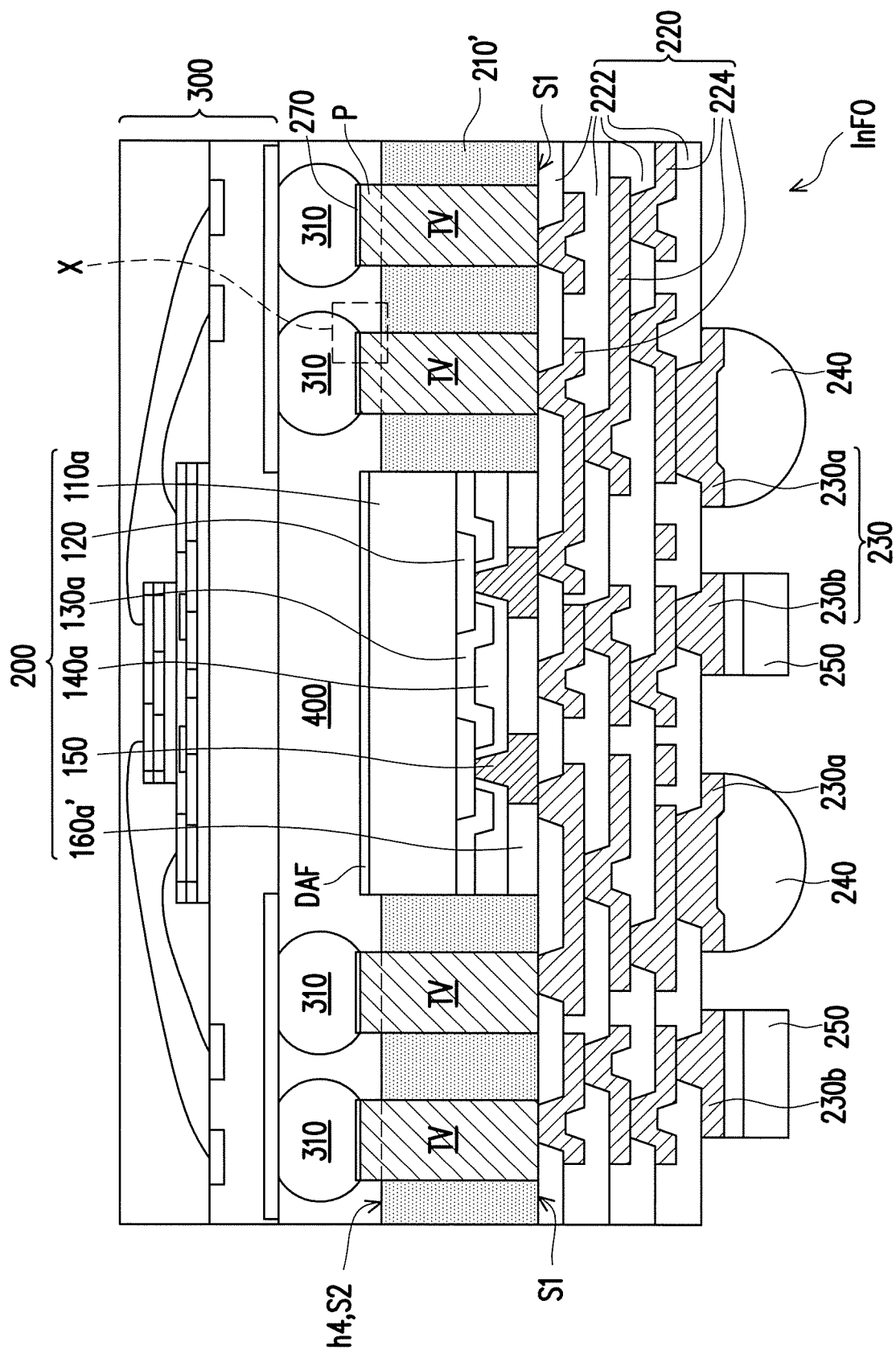
FIG. 15 is a cross-sectional view illustrating a package-on-package (POP) structure in accordance with some embodiments.

FIGS. 1 through 14 illustrate a process flow for fabricating a package structure in accordance with some embodiments, and FIG. 15 is a cross-sectional view illustrating a package-on-package (POP) structure in accordance with some embodiments.

Referring to FIG. 1, a wafer 100 including a plurality of dies or integrated circuit components 200 which are arranged in an array is provided. Before performing a wafer dicing process on the wafer 100, the integrated circuit components 200 of the wafer 100 are physically connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 partially exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer made from other suitable dielectric polymers.

Figure 2:
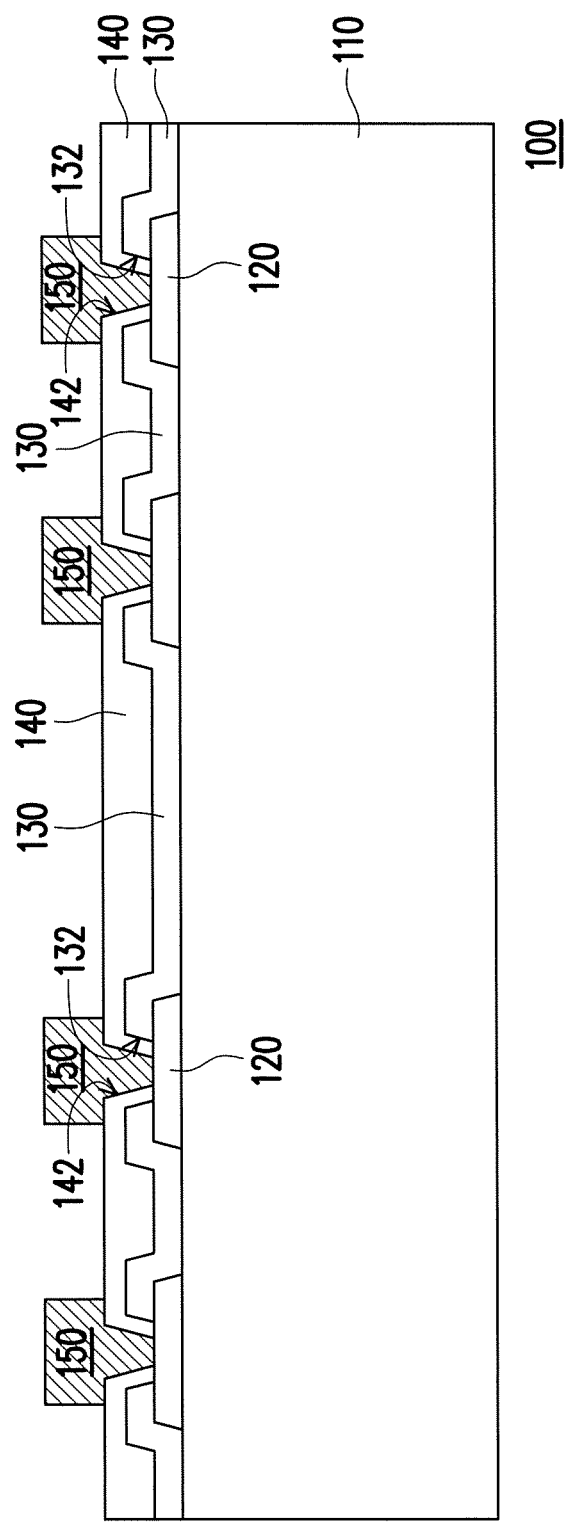

Referring to FIG. 2, a plurality of conductive pillars 150 are formed on the conductive pads 120 of the wafer 100. In some embodiments, the conductive pillars 150 are formed on the conductive pads 120 by a plating process of a conductive material. The plating process of conductive pillars 150 is described in detail as followings. First, a seed layer is sputtered onto the post-passivation layer 140 and the conductive pads 120 exposed by the contact openings 142. A patterned photoresist layer (not shown) having a predetermined pattern is then formed over the seed layer by spin coating of a photoresist material layer, baking of the photoresist material layer, and photolithography (i.e. exposure and development processes). Portions of the seed layer that are corresponding to the conductive pads 120 are exposed by the patterned photoresist layer. The wafer 100 including the patterned photoresist layer formed thereon is then immersed into a plating solution in a plating bath such that the conductive pillars 150 are plated on the portions of the seed layer that are corresponding to the conductive pads 120 and revealed by the patterned photoresist layer. After the conductive pillars 150 are formed, the patterned photoresist layer is stripped by, for example, etching, ash or other suitable removal processes. Thereafter, by using the conductive pillars 150 as a hard mask, another portions of the seed layer that are not covered by the conductive pillars 150 are removed through etching until the post passivation layer 140 is exposed, for example.

In some embodiments, the conductive pillars 150 are plated copper pillars or other suitable metallic pillars. In some alternative embodiments, the conductive pillars 150 are copper pillars or other suitable metallic pillars which are covered by solder caps (e.g., lead-free solder caps).

Figure 3:
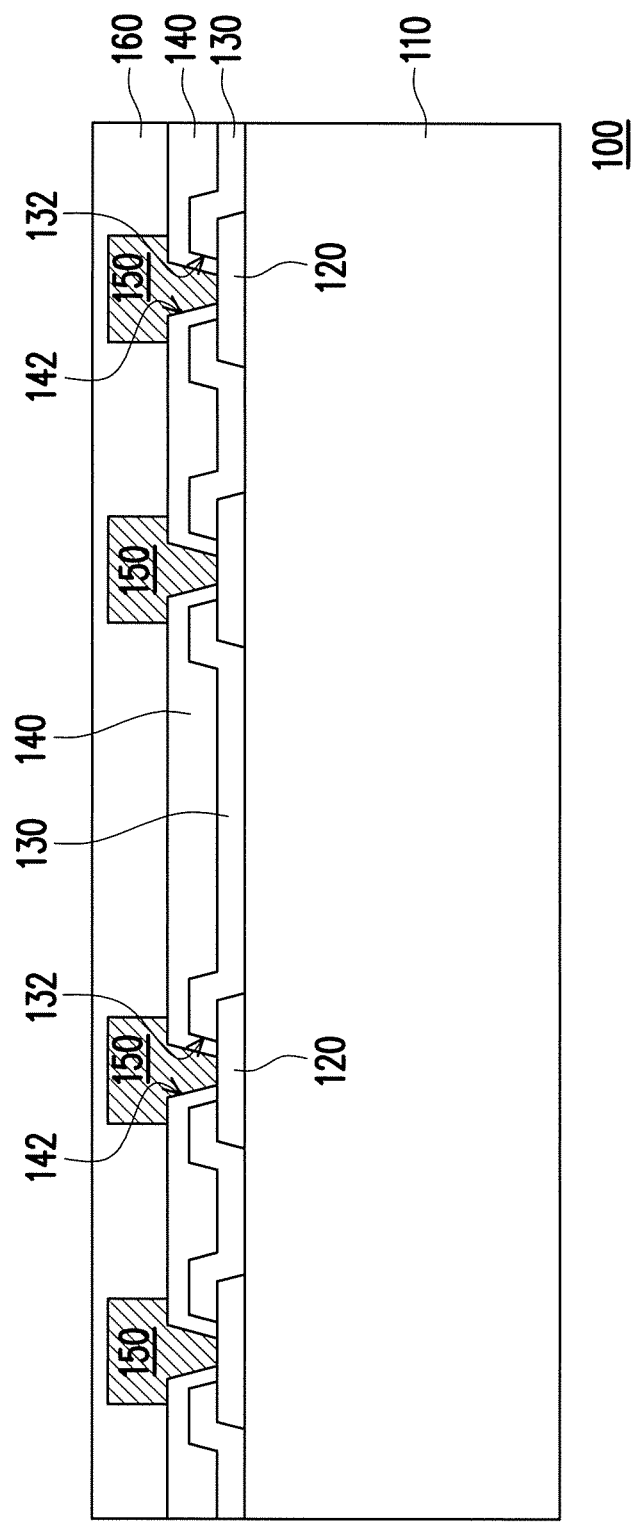

Referring to FIG. 3, after forming the conductive pillars 150, a protection layer 160 is formed on the post passivation layer 140 of the wafer 100 such that the conductive pillars 150 are covered by the protection layer 160. In some embodiments, the protection layer 160 may be a polymer layer having sufficient thickness to encapsulate and protect the conductive pillars 150. In some embodiments, the protection layer 160 may be a polybenzoxazole (PBO) layer, a polyimide (PI) layer or other suitable polymer layer. In some alternative embodiments, the protection layer 160 may be made of inorganic materials. As shown in FIG. 3, the protection layer 160 has a substantially planar top surface and a maximum thickness of the protection layer 160 is greater than a height of the conductive pillars 150.

Figure 4:
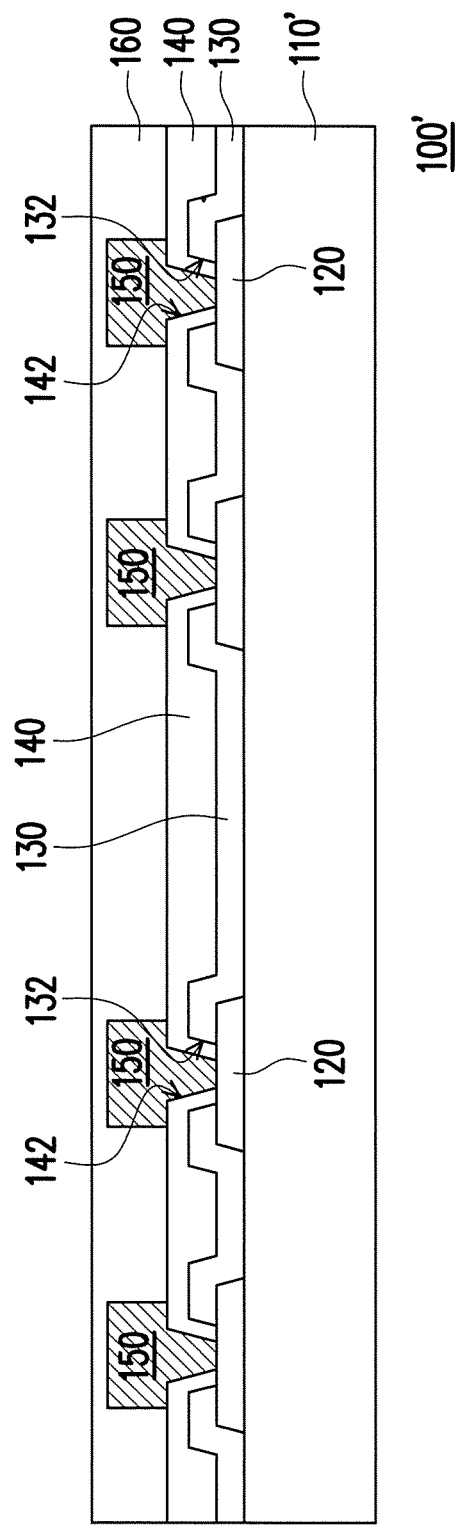

Referring to FIG. 4, after forming the protection layer 160, a back side grinding process may be optionally performed on the back surface of the wafer 100. During the back side grinding process, the semiconductor substrate 110 is partially grinded such that a thinned wafer 100' including a thinned semiconductor substrate 110' is formed. In some embodiments, the back surface of the wafer 100 may be grinded by mechanical grinding or other suitable grinding or polishing processes.

Figure 5:
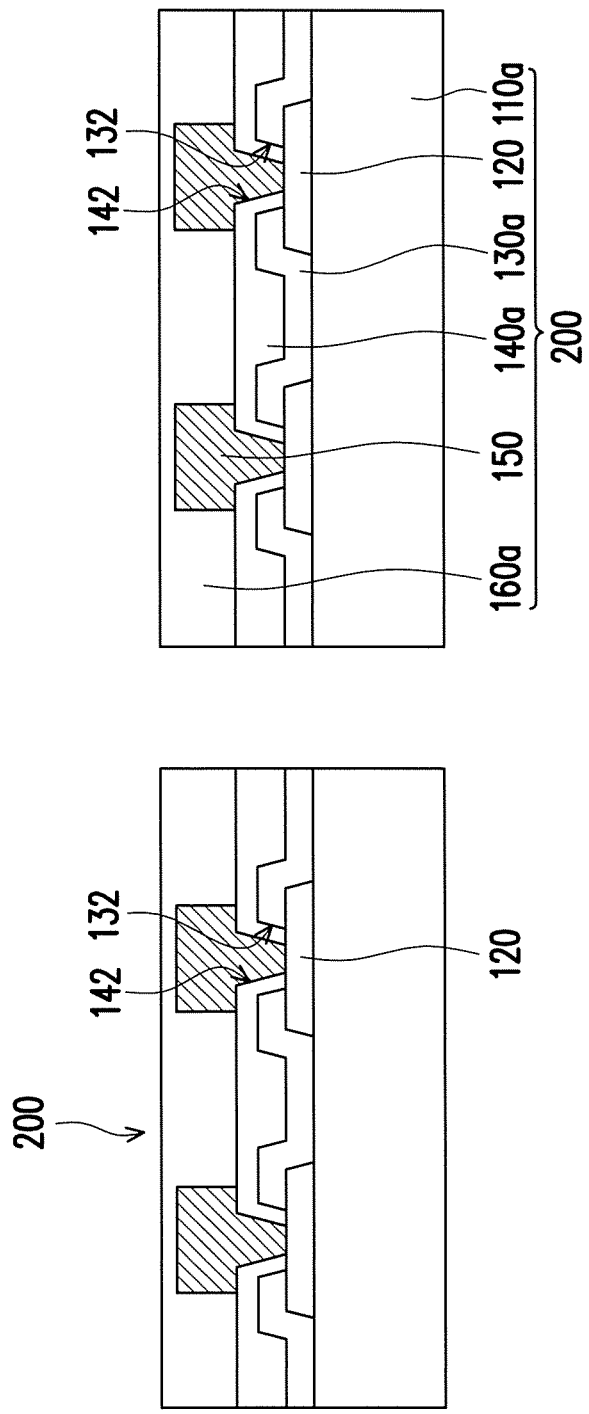

Referring to FIG. 5, after performing the back side grinding process, a wafer dicing process is performed on the thinned wafer 100' such that the integrated circuit components 200 in the thinned wafer 100' are singulated from one another. Each one of the singulated integrated circuit components 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding process and the wafer dicing process, the protection layer 160 and 160a may well protect the conductive pillars 150 of the integrated circuit components 200. In addition, the conductive pillars 150 of the integrated circuit components 200 may be protected from being damaged by sequentially performed processes, such as the pick-up and placing process of the integrated circuit components 200, the molding process, and so on.

Figure 6:
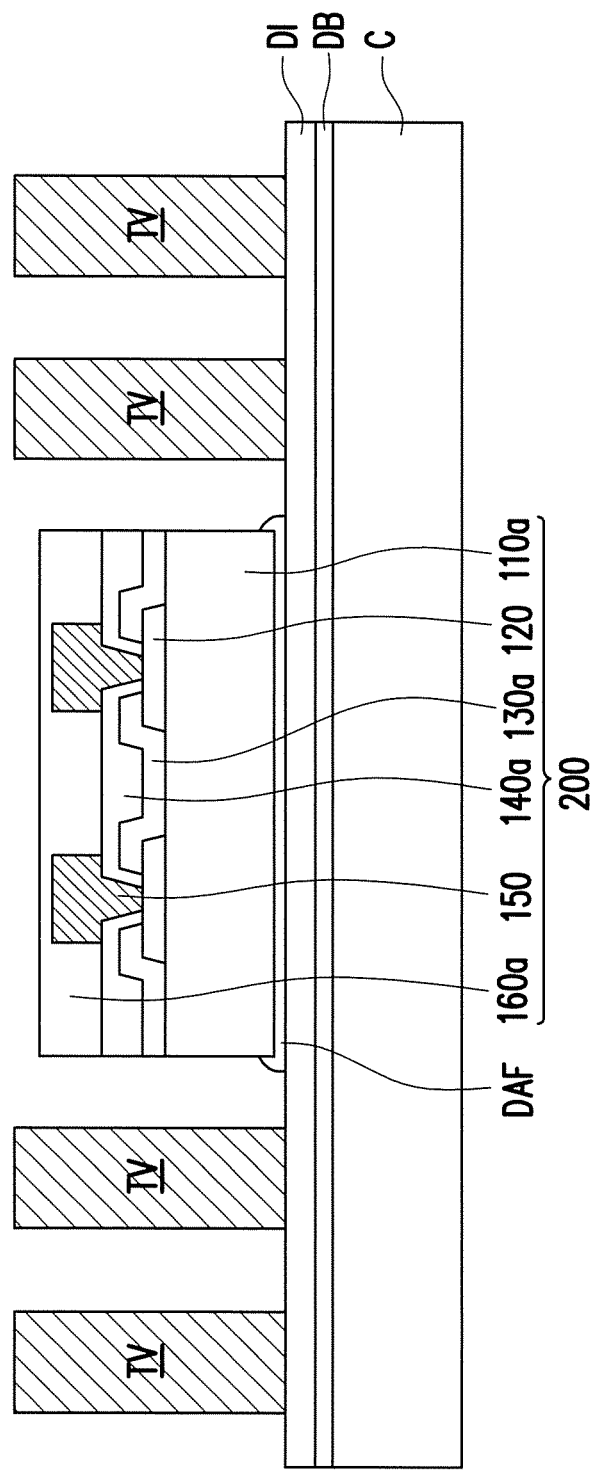

Referring to FIG. 6, after the integrated circuit components 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C may be a glass substrate, the de-bonding layer DB may be a light-to-heat conversion (LTHC) release layer formed on the glass substrate, and the dielectric layer DI may be a polybenzoxazole (PBO) layer formed on the de-bonding layer DB. In some alternative embodiments, the dielectric layer DI may be omitted. the integrated circuit component 200 may be placed on the de-bonding layer DB and adhered with the de-bonding layer DB through a die attachment film DAF.

After the carrier C having the de-bonding layer DB and the dielectric layer DI formed thereon is provided, a plurality of conductive through vias TV are formed on the dielectric layer DI. In some embodiments, the plurality of conductive through vias TV is formed by seed layer formation, spin coating of a photoresist material layer, baking of the photoresist material layer, photolithography (i.e. exposure and development processes), plating (e.g., electro-plating or electro-less plating), photoresist stripping, and seed layer patterning processes. For example, the conductive through vias TV include copper posts or other suitable metallic posts.

In some embodiments, before the formation of the conductive through vias TV, a back side redistribution circuit structure (not shown) may be formed on the dielectric layer DI carried by the carrier C and the conductive through vias TV may be formed on and electrically connected to the back side redistribution circuit structure.

As shown in FIG. 6, in some embodiments, one of the integrated circuit components 200 including the conductive pads 120, the conductive pillars 150, and a protection layer 160a formed thereon is picked and placed on the dielectric layer DI carried by the carrier C. As shown in FIG. 6, the integrated circuit component 200 is attached or adhered on the dielectric layer DI through a die attachment film DAF or the like. In some alternative embodiments, two or more of the integrated circuit components 200 are picked, placed on and attached onto the dielectric layer DI carried by the carrier C, wherein the integrated circuit components 200 placed on the dielectric layer DI may be arranged in an array. In some embodiments, when the integrated circuit components 200 placed on the dielectric layer DI are arranged in an array, the conductive through vias TV may be classified into groups. The number of the integrated circuit components 200 is corresponding to the number of the groups of the conductive through vias TV.

As shown in FIG. 6, the top surface of the protection layer 160a is lower than the top surfaces of the conductive through vias TV. However, the disclosure is not limited thereto. In some alternative embodiments, the top surface of the protection layer 160a may be substantially aligned with the top surfaces of the conductive through vias TV. In yet some alternative embodiments, the top surface of the protection layer 160a may be higher than the top surfaces of the conductive through vias TV and the top surfaces of the conductive pillars 150 may be lower than, higher than or substantially aligned with the top surfaces of the conductive through vias TV.

As shown in FIG. 6, at least one of the integrated circuit components 200 is picked and placed on the dielectric layer DI after the formation of the conductive through vias TV. However, the disclosure is not limited thereto. In some alternative embodiments, at least one of the integrated circuit components 200 is picked and placed on the dielectric layer DI before the formation of the conductive through vias TV.

Figure 7:
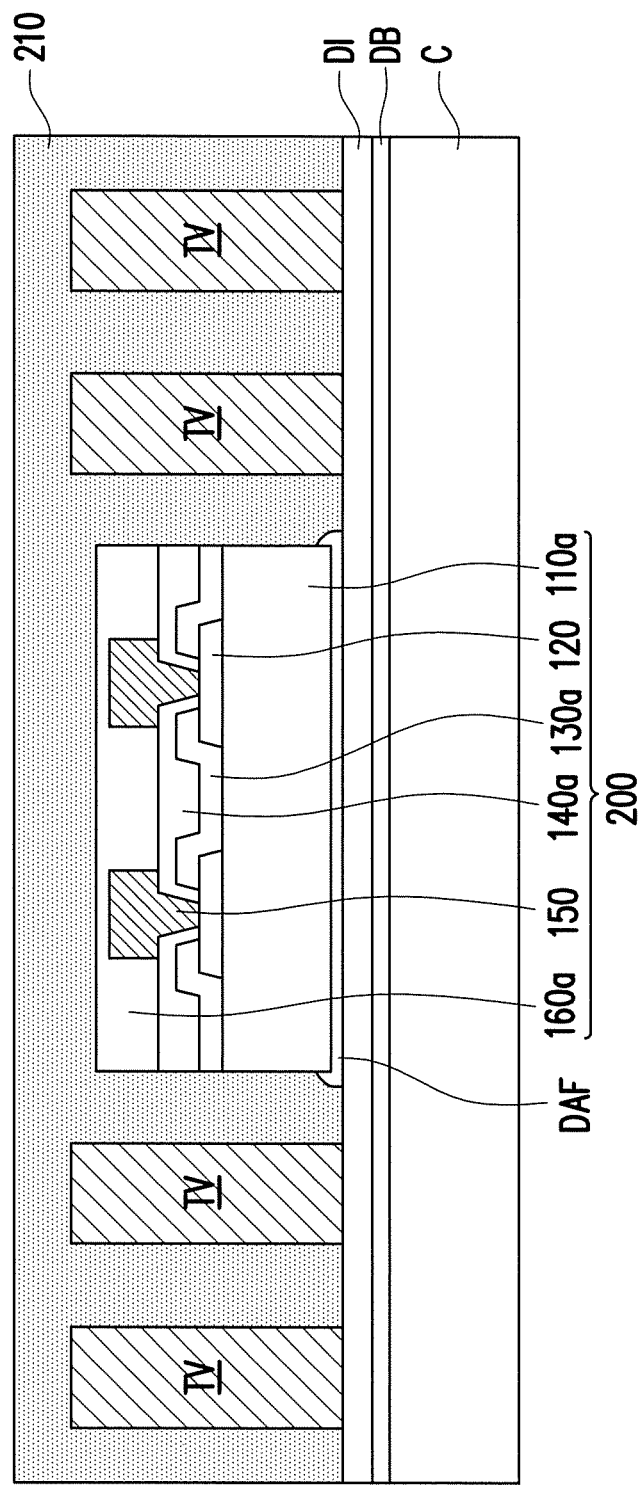

Referring to FIG. 7, an insulating material 210 is formed on the dielectric layer DI to cover the die attachment film DAF, the integrated circuit component 200 and the conductive through vias TV. In some embodiments, the insulating material 210 is a molding compound formed by a molding process. The conductive pillars 150 and the protection layer 160a of the integrated circuit component 200 are covered by the insulating material 210. In other words, the conductive pillars 150 and the protection layer 160a of the integrated circuit component 200 are not revealed and are well protected by the insulating material 210. In some embodiments, the insulating material 210 includes epoxy resin or other suitable dielectric materials.

Figure 8:
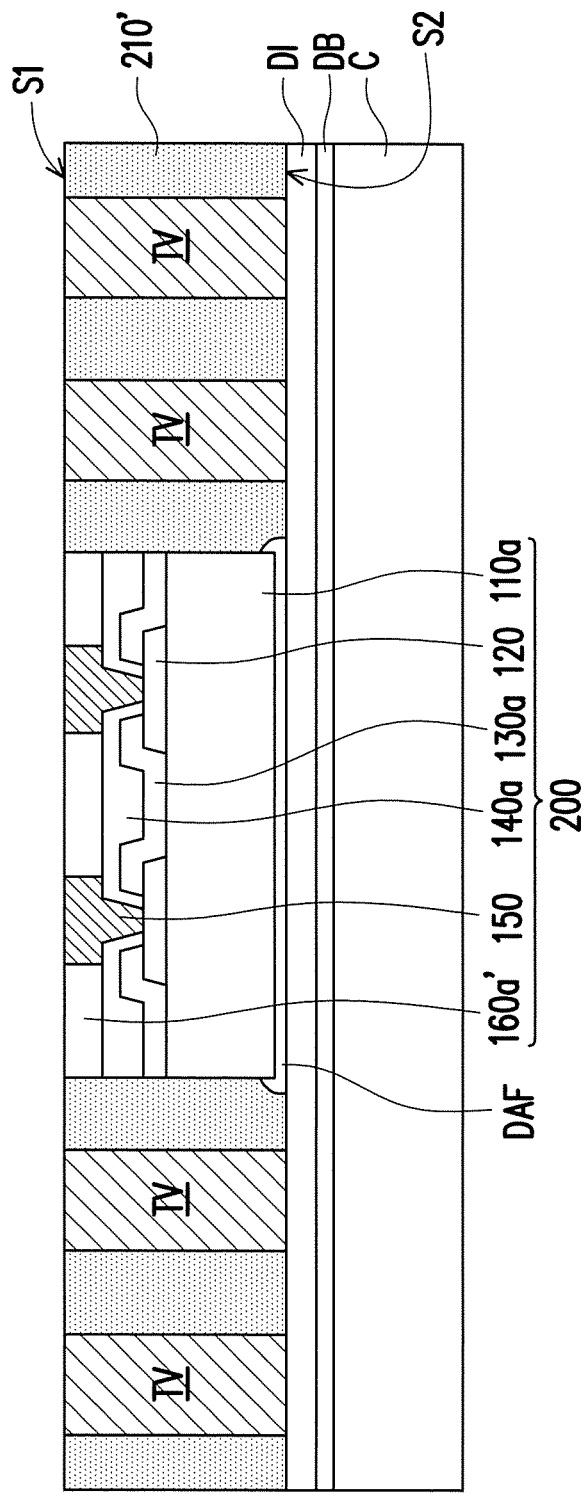

Referring to FIG. 8, the insulating material 210 is then grinded until the top surfaces of the conductive pillars 150, the top surfaces of the conductive through vias TV, and the top surface of the protection layer 160a are exposed. In some embodiments, the insulating material 210 is grinded by a mechanical grinding process and/or a chemical mechanical polishing (CMP) process. After the insulating material 210 is grinded, an insulating encapsulation 210' having a first surface S1 (e.g., a top surface) and a second surface S2 (e.g., a bottom surface) that is opposite to the first surface S1 is formed over the dielectric layer DI. The second surface S2 of the insulating encapsulation 210' is in contact with the dielectric layer DI. During the grinding process of the insulating material 210, portions of the protection layer 160a are grinded to form a protection layer 160a'. In some embodiments, during the grinding process of the insulating material 210 and the protection layer 160a, portions of the conductive through vias TV and portions of the conductive pillars 150 are slightly grinded also.

As shown in FIG. 8, the insulating encapsulation 210' laterally encapsulates sidewalls of the integrated circuit component 200 and the conductive through vias TV. The insulating encapsulation 210' is penetrated by the conductive through vias TV. It is noted that the top surfaces of the conductive through vias TV, the first surface S1 of the insulating encapsulation 210', and the top surfaces of the conductive pillars 150 are substantially coplanar with the top surface of the protection layer 160a'.

Figure 9:
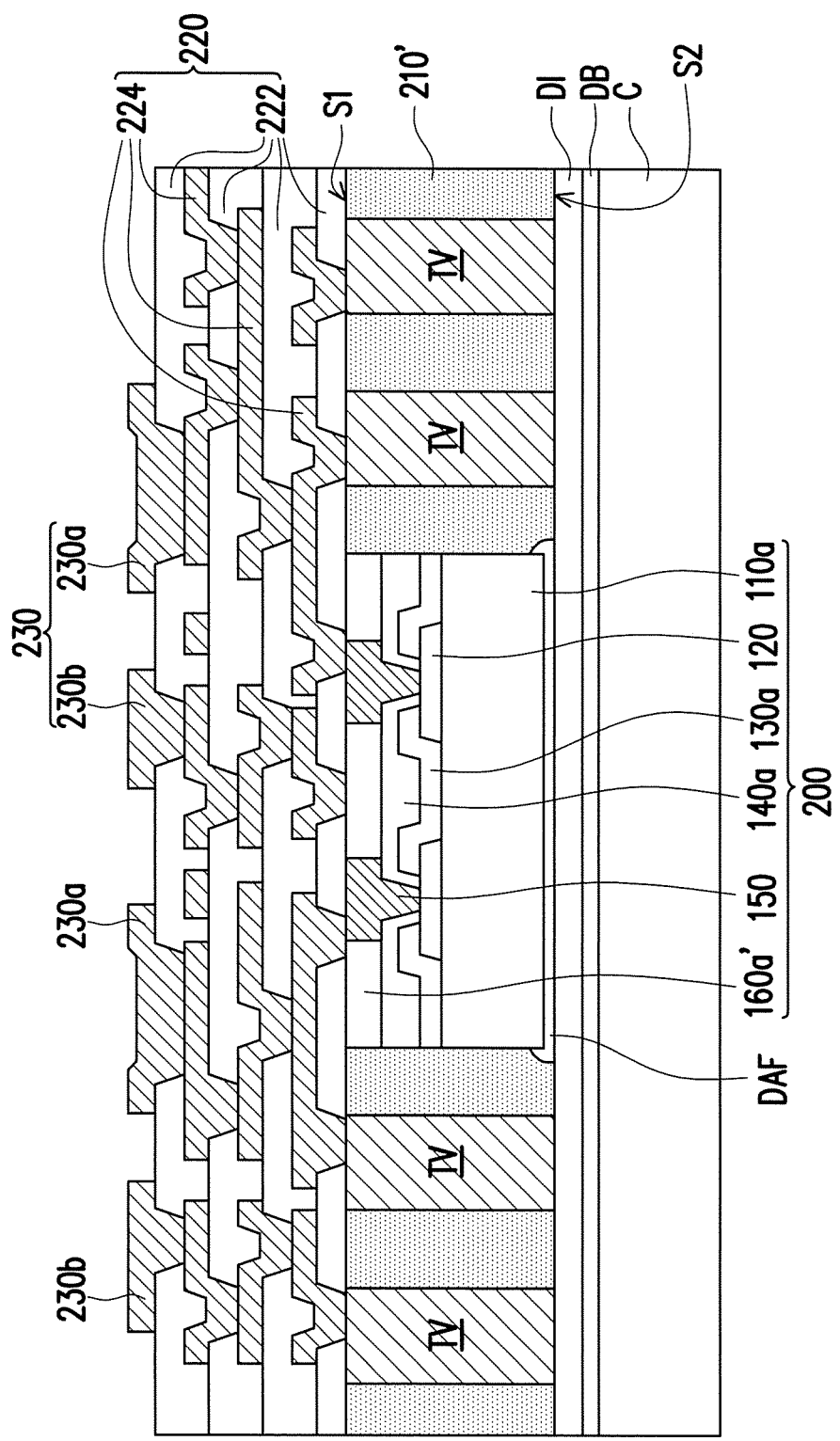

Referring to FIG. 9, after forming the insulating encapsulation 210' and the protection layer 160a', a redistribution circuit structure 220 electrically connected to the conductive pillars 150 of the semiconductor device component 200 and the conductive through vias TV is formed on the top surfaces of the conductive through vias TV is formed on the top surfaces of the conductive through vias TV, the first surface S1 of the insulating encapsulation 210', the top surfaces of the conductive pillars 150, and the top surface of the protection layer 160a'. Since the redistribution circuit structure 220 is fabricated over the semiconductor device component 200 and the insulating encapsulation 210', the redistribution circuit structure 220 is a so-called front side redistribution circuit structure. In some embodiments, the front side redistribution circuit structure 220 includes a plurality of inter-dielectric layers 222 and a plurality of redistribution conductive layers 224 stacked alternately, and the redistribution conductive layers 224 are electrically connected to the conductive pillars 150 of the integrated circuit component 200 and the conductive through vias TV embedded in the insulating encapsulation 210'. The top surfaces of the conductive pillars 150 and the top surfaces of the conductive through vias TV are partially covered by a bottommost one of the inter-dielectric layers 222.

Referring to FIG. 9, after the redistribution circuit structure 220 is formed, a plurality of pads 230 are then formed on the topmost redistribution conductive layer 224 of the redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the redistribution circuit structure 220. In other words, the pads 230 are electrically connected to the conductive pillars 150 of the integrated circuit component 200 and the conductive through vias TV through the redistribution circuit structure 220. It is noted that the number of the UBM patterns 230a and the connection pads 230b is not limited in this disclosure.

Figure 10:
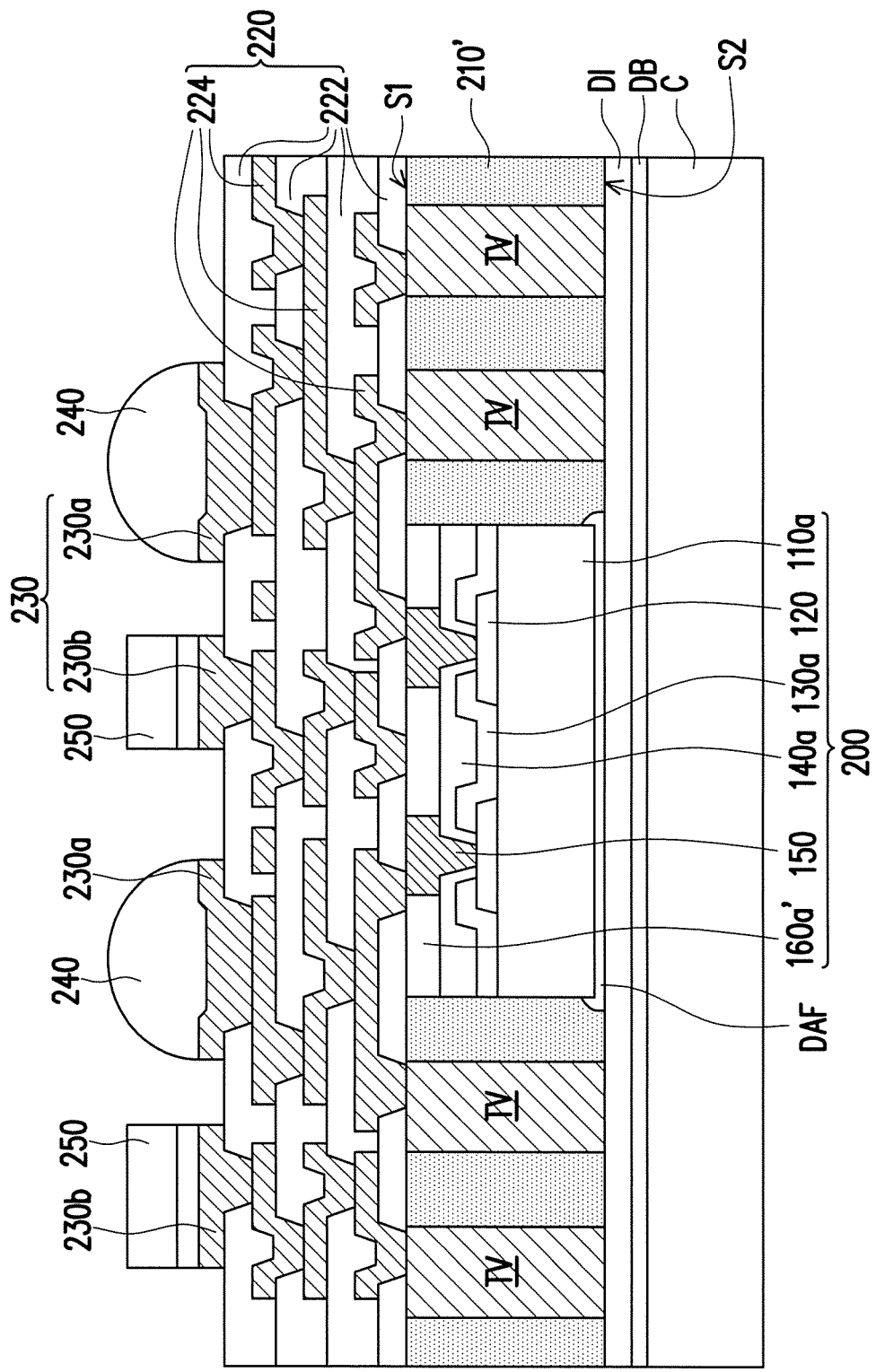

Referring to FIG. 10, after forming the UBM patterns 230a and the connection pads 230b, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process and the passive components 250 may be mounted on the connection pads 230b through a soldering or reflowing process. In some embodiments, the height of the conductive balls 240 is greater than the height of the passive components 250, for example. It is noted that the mount of the passive components 250 may be micro-bumps, for example. The mount method and joint profile are not limited in this disclosure. Furthermore, the number of the passive components 250 and the number of the connection pads 230b are not limited in this disclosure.

Figure 11:
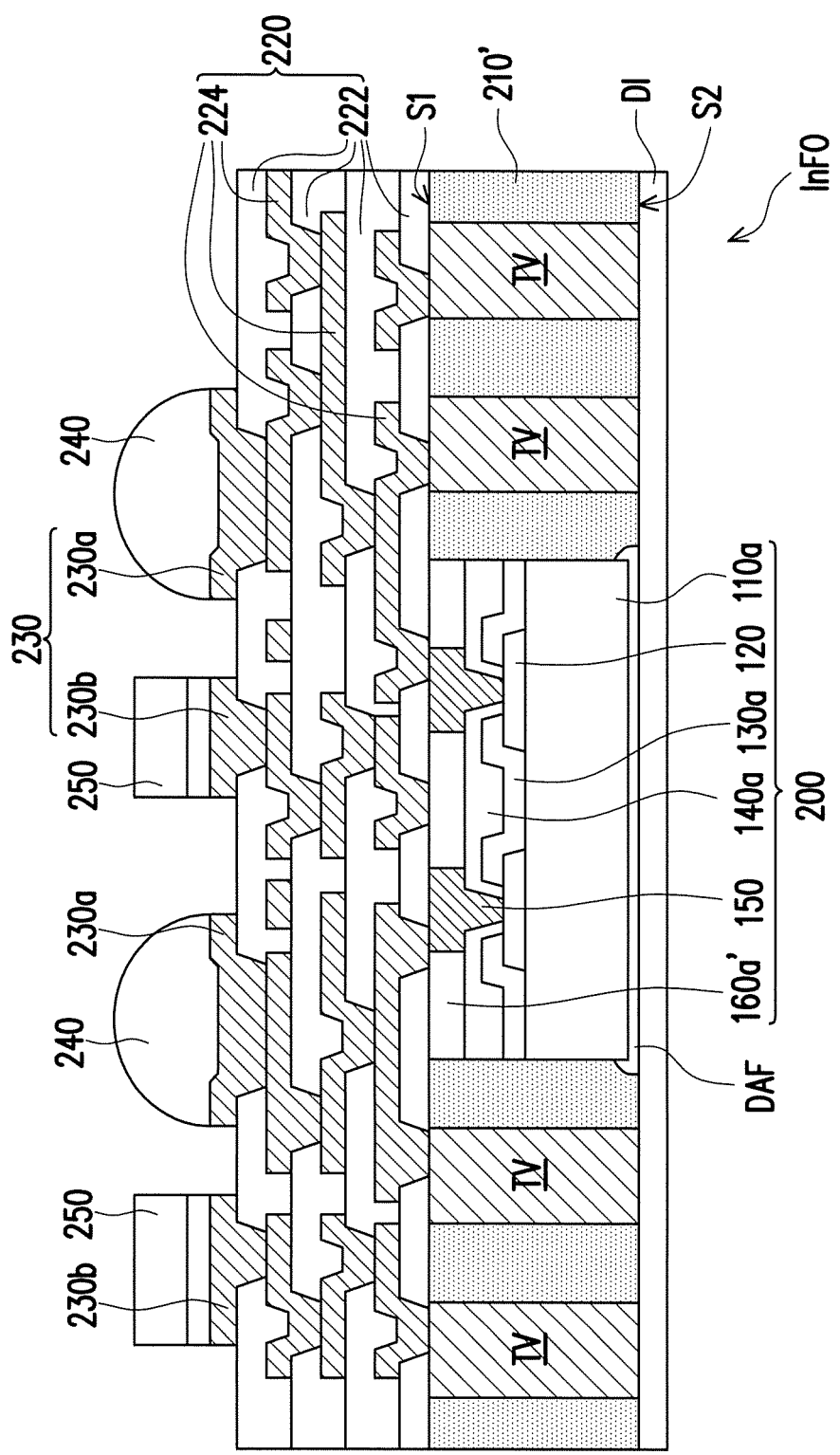

Referring to FIG. 10 and FIG. 11, after the conductive balls 240 and the passive components 250 are mounted on the pads 230, the fabrication of an integrated fan-out package InFO is accomplished. After the fabrication of the integrated fan-out package InFO is accomplished, the integrated fan-out package InFO is de-bonded from the de-bonding layer DB. As shown in FIG. 10 and FIG. 11, the dielectric layer DI formed on the second surface S2 of the insulating encapsulation 210' is de-bonded from the de-bonding layer DB such that the dielectric layer DI formed on the second surface S2 of the insulating encapsulation 210' is separated from the carrier C. In some embodiments, the de-bonding layer DB (e.g., the LTHC release layer) may be irradiated by an UV laser such that the dielectric layer DI is peeled from the carrier C.

Figure 12:
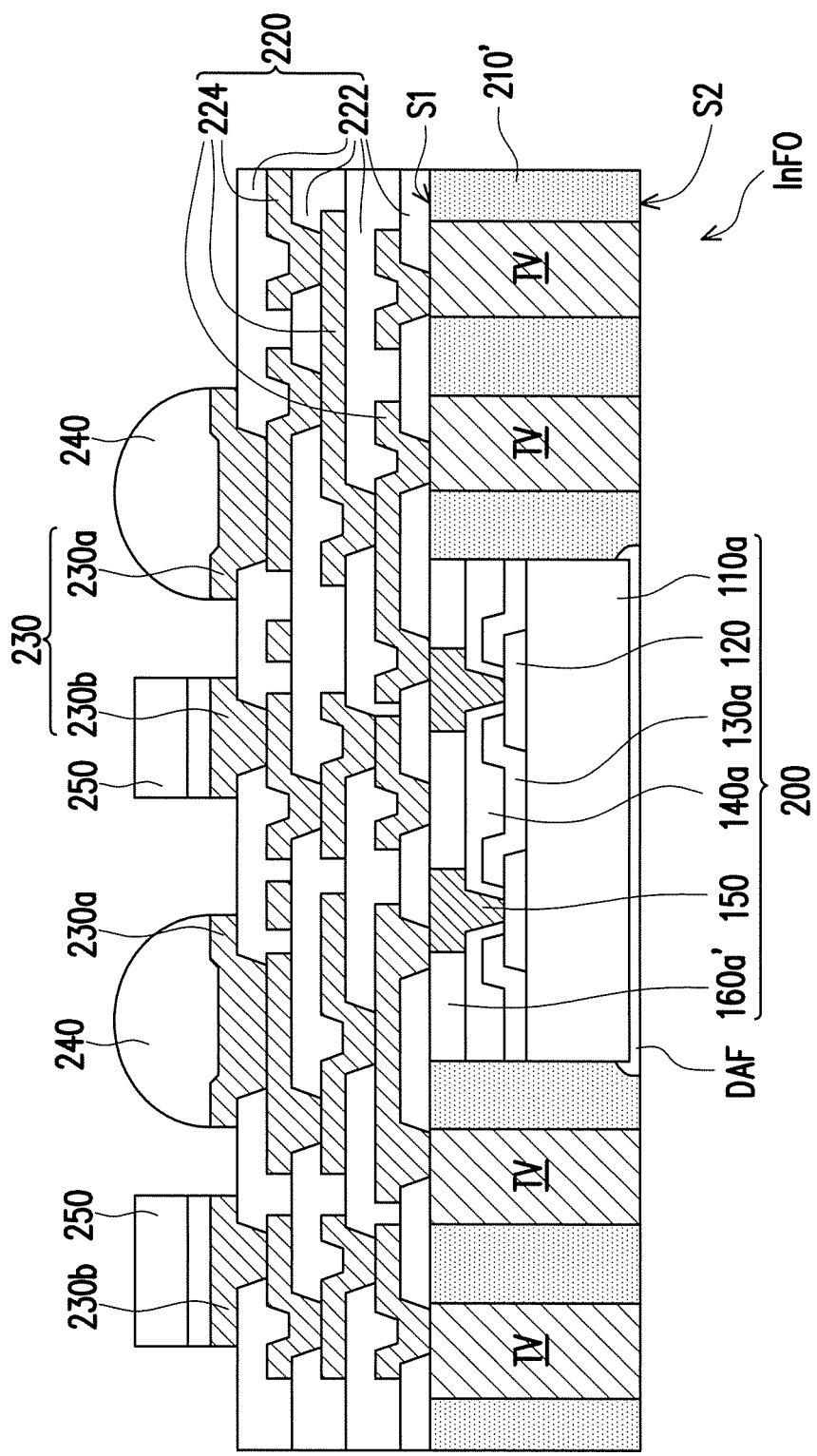

As shown in FIG. 11 and FIG. 12, the dielectric layer DI is then entirely removed so as to expose the bottom surfaces of the conductive through vias TV, the die attachment film DAF and the second surface S2 of the insulating encapsulation 210'. In such embodiment, the dielectric layer DI may be removed by an etching process or other suitable processes. In some alternative embodiments, it is not required to remove the dielectric layer DI when the dielectric layer DI is not used. In other words, after the dielectric layer DI is peeled from the carrier C, the bottom surfaces of the conductive through vias TV, the die attachment film DAF and the second surface S2 of the insulating encapsulation 210' are exposed when the formation of the dielectric layer DI is omitted.

Figure 13:
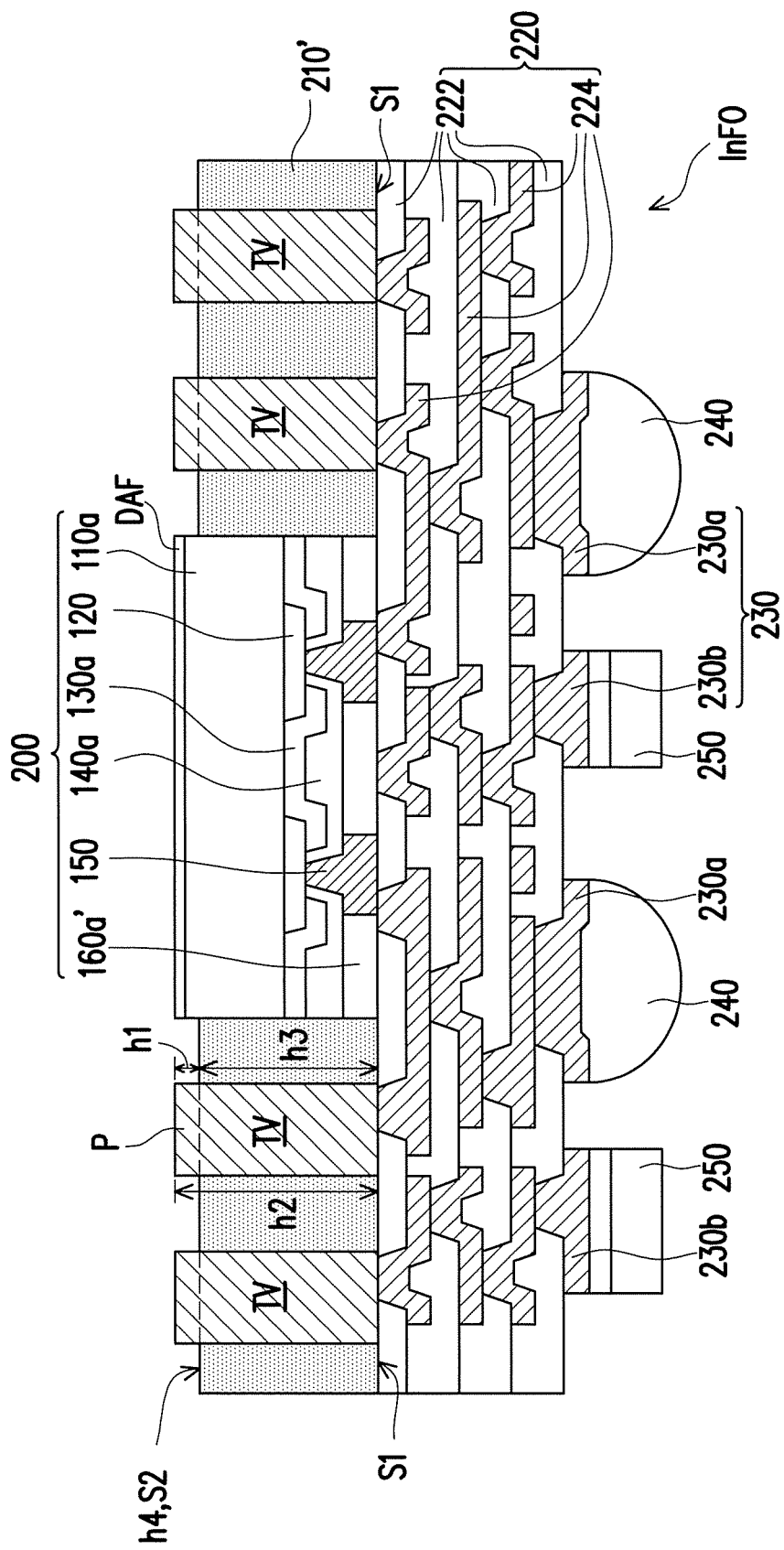

Referring to FIG. 13, after removing the dielectric layer DI, a recessing process is performed on the second surface S2 of the insulating encapsulation 210' so as to lower the second surface S2 of the insulating encapsulation 210' and to partially reveal the conductive through vias TV. In some embodiments, the insulating encapsulation 210' is partially removed from the second surface S2 by an etching process (e.g., dry etch or wet etch) so as to reveal a plurality of protruding portions P of the conductive through vias TV. In such embodiment, a thickness of the insulating encapsulation 210' is reduced by the above-mentioned etching process and the protruding portions P of the conductive through vias TV are accessibly revealed by the insulating encapsulation 210' after partially removing the insulating encapsulation 210'. It is noted that top surfaces and sidewalls of the protruding portions P are exposed after performing the recessing process of the insulating encapsulation 210'.

In some embodiments, the die attachment film DAF attached on a rear surface of the integrated circuit component 200 remains after performing the recessing process. As shown in FIG. 13, the die attachment film DAF may be partially removed and have reduced volume. In some alternative embodiments, the die attachment film DAF is removed and the rear surface of the integrated circuit component 200 is exposed after performing the recessing process.

As shown in FIG. 13, after performing the recessing process of the insulating encapsulation 210', the protruding portions P protrude from the second surface S2 of the insulating encapsulation 210'. In some embodiments, each of the protruding portions P has first height (h1) and the first height (h1) may range from about 0.5 micrometers to about 60 micrometers; a second height (h2) of each of the conductive through vias TV is greater than a third height or thickness (h3) of the insulating encapsulation 210', wherein the second height (h2) of each of conductive through vias TV may range from about 50.5 micrometers to about 310 micrometers; and the third height (h3) may range from about 50 micrometers to about 250 micrometers. In some embodiments, a roughness (h4) of the second surface S2 of the insulating encapsulation 210' is less than the first height (h1).

Referring to FIG. 14 and FIG. 15, a semiconductor device 300 including a plurality of conductive terminals 310 (e.g., lead-free solder balls) formed on a bottom surface thereof is provided above the integrated fan-out package InFO, as shown in FIG. 14, and the semiconductor device 300 is then placed on the exposed surfaces of the conductive through vias TV, as shown in FIG. 15. The conductive terminals 310 are, for example, reflowed to bond with and electrically connect to the exposed protruding portions P of the conductive through vias TV such that the semiconductor device 300 is electrically connected to the protruding portions P of the integrated fan-out package InFO through the conductive terminals 310. As shown in FIG. 15, after performing the above-mentioned reflowing process, the exposed top surfaces of the protruding portions P are covered by the reflowed conductive terminals 310 and a plurality of intermetallic compound caps 270 are formed between the reflowed conductive terminals 310 and the top surfaces of the protruding portions P. Since the top surfaces of the protruding portions P are covered by the reflowed conductive terminals 310, the intermetallic compound caps 270 are generated and cover the top surfaces of the protruding portions P. In some embodiments, a thickness of the intermetallic compound caps 270 may relevant to the thermal budge, the thickness of the intermetallic compound caps 270 is not limited in this disclosure.

In some embodiments, the semiconductor device 300 stacked over the second surface S2 of the insulating encapsulation 210' is, for example, a memory device or other suitable semiconductor devices.

As shown in FIG. 14 and FIG. 15, the conductive terminals 310 are formed on the semiconductor device 300 in advance and the intermetallic compound caps 270 are generated when the conductive terminals 310 formed on the semiconductor device 300 are pressed on and reflowed to bond with the protruding portions P. In other words, the conductive terminals 310 may be considered as parts of the semiconductor device 300. The conductive terminals 310 may be provided by other manners and the present disclosure does not limit the fabrication of the conductive terminals 310.

After the electrical bonding of the semiconductor device 300 and the integrated fan-out package InFO is accomplished, an underfill 400 is formed between the semiconductor device 300 and the integrated fan-out package InFO so as to encapsulate the conductive terminals 310 and the protruding portions P between the semiconductor device 300 and the integrated fan-out package InFO. In some embodiments, since the sidewalls of the protruding portions P are not entirely covered by the reflowed conductive terminals 310, the underfill 400 is in contact with the protruding portions P of the conductive through vias TV. Delamination between the underfill 400 and conductive terminals 310 (e.g., solder) and/or delamination between the underfill 400 and the intermetallic compound 270 may be reduced by the heterogeneous interface between the underfill 400 and the protruding portion P.

Figure 16B:
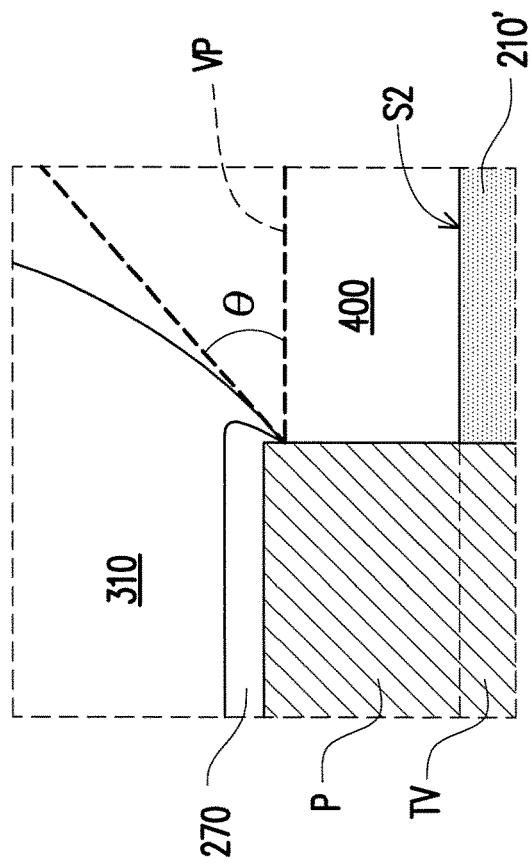
FIG. 16A and FIG. 16B schematically illustrate enlarged views of the region X shown in FIG. 15 in accordance with various embodiments.
Figure 16A:
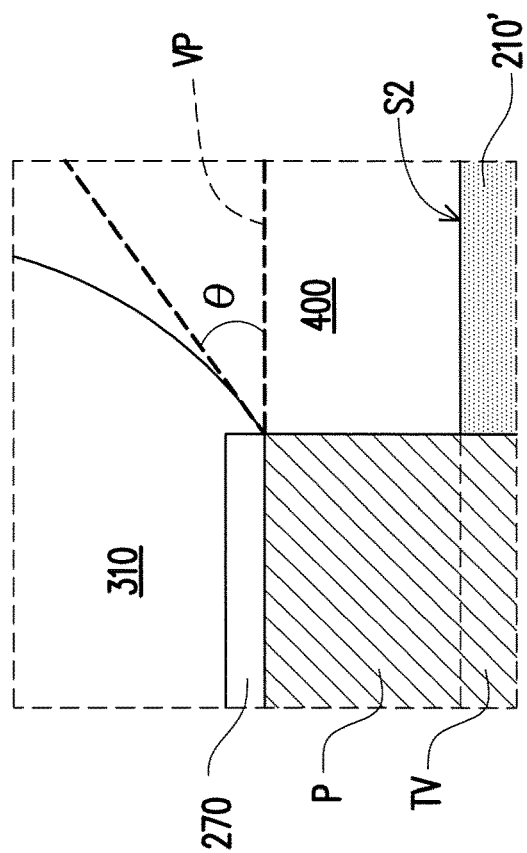

FIG. 16A and FIG. 16B schematically illustrate enlarged views of the region X shown in FIG. 15 in accordance with various embodiments. Referring to FIG. 16A, in some embodiments, an included angle θ between lower side surfaces of the conductive terminals 310 and a virtual plane VP substantially parallel with the second surface S2 of the insulating encapsulation 210' may range from about 10 degrees to about 60 degrees. Since the sidewalls of the protruding portions P are partially exposed by the insulating encapsulation 210', the included angle θ between the lower side surfaces of the conductive terminals 310 and the virtual plane VP that is substantially parallel with the second surface S2 of the insulating encapsulation 210' is increased. Accordingly, the bonding reliability between the conductive terminals 310 and the protruding portions P is enhanced by the protruding portions P (i.e. the height difference between the top surfaces of the conductive through vias TV and the second surface S2 of the insulating encapsulation 210').

In some alternative embodiments, as shown in FIG. 16B, the reflowed conductive terminals 310 may entirely cover the top surfaces of the protruding portions P and slightly cover the sidewalls of the protruding portions P. In other words, parts of the sidewalls of the protruding portions P that are in proximity of the top surfaces of the protruding portion P are covered by the reflowed conductive terminals 310 and the rest parts of the sidewalls of the protruding portions P are not covered by the reflowed conductive terminals 310.

Figure 17:
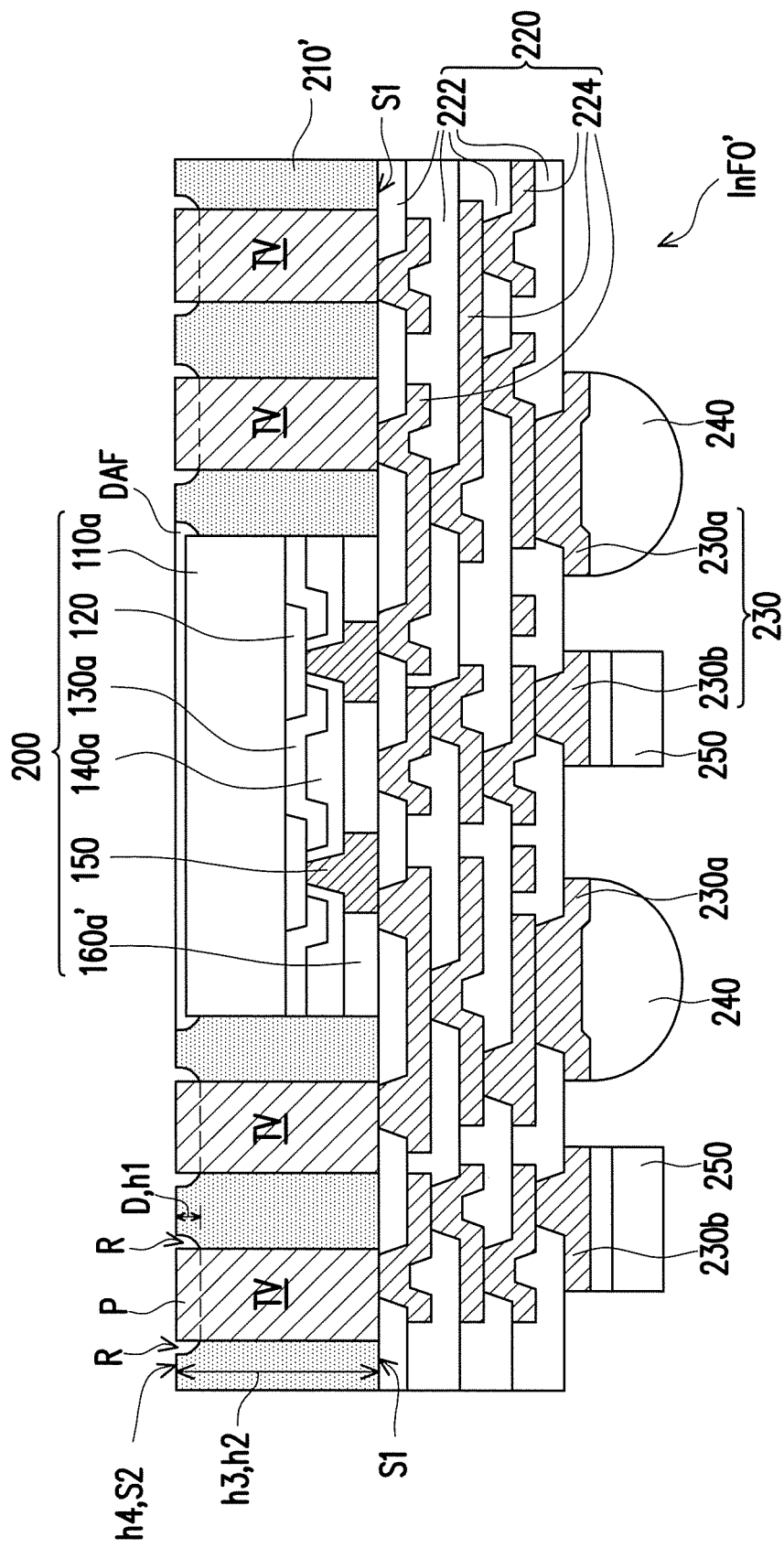
FIG. 17 illustrates another a recessing process performed on the second surface S2 of the insulating encapsulation 210' in accordance with some alternative embodiments.
Figure 18:
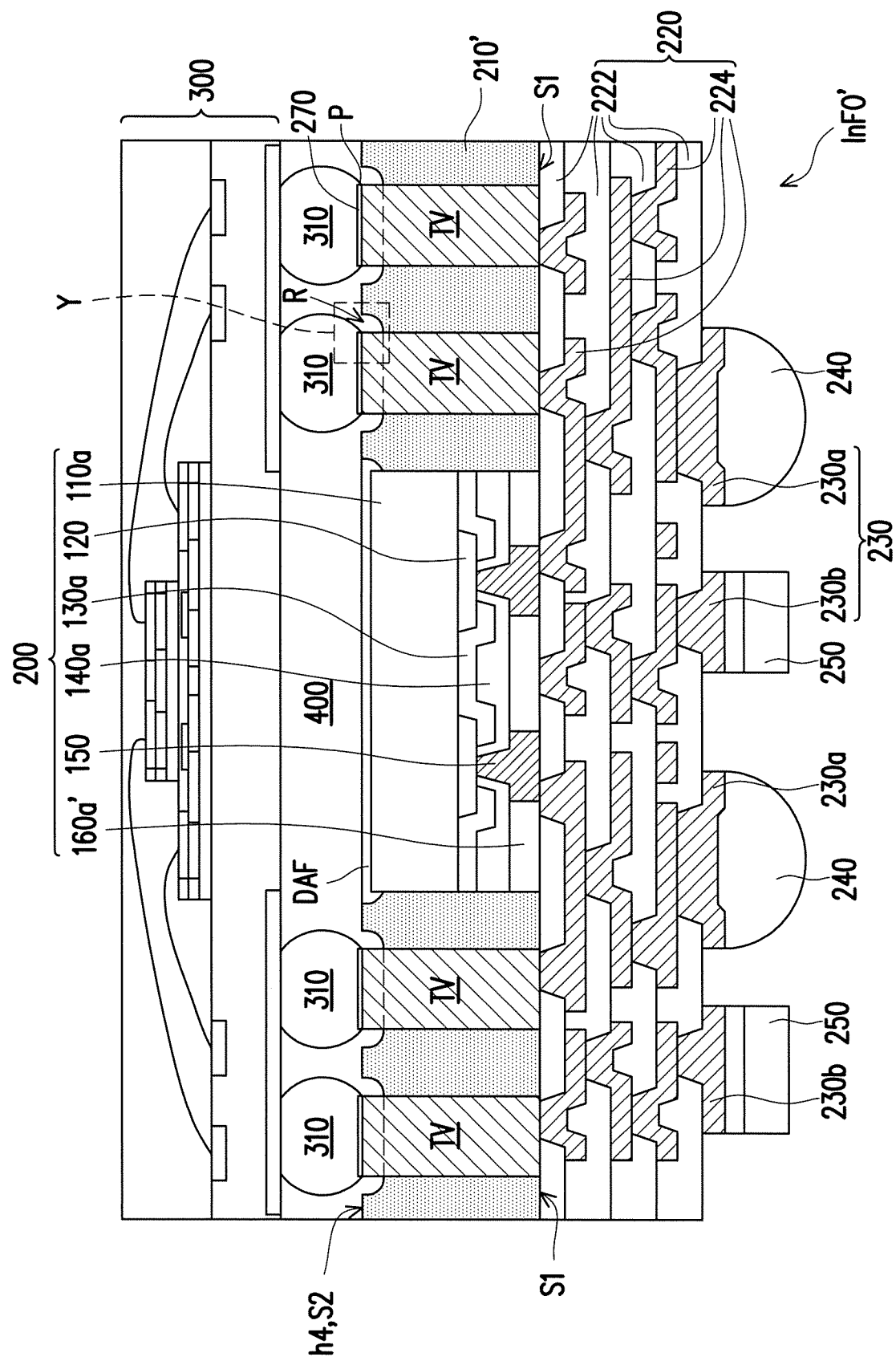
FIG. 18 is a cross-sectional view illustrating a package-on-package (POP) structure in accordance with some alternative embodiments.

FIG. 17 illustrates another a recessing process performed on the second surface S2 of the insulating encapsulation 210' in accordance with some alternative embodiments. FIG. 18 is a cross-sectional view illustrating a package-on-package (POP) structure in accordance with some alternative embodiments.

Referring to FIG. 12 and FIG. 17, a recessing process is performed on the second surface S2 of the insulating encapsulation 210' so as to form a plurality of recesses R distributed on the second surface S2 of the insulating encapsulation 210' and the protruding portions P are surrounded by the recesses R. In some embodiments, parts of the insulating encapsulation 210' located in the proximity of the conductive through vias TV are partially removed from the second surface S2 by a laser drilling process so as to reveal a plurality of protruding portions P of the conductive through vias TV. In such embodiment, each of the protruding portions P has first height (h1) and the first height (h1) may range from about 0.5 micrometers to about 60 micrometers and a depth D of the recesses R may range from about 0.5 micrometers to about 60 micrometers. The first height (h1) of the protruding portions P is substantially equal to the depth D of the recesses R. It is noted that top surfaces and sidewalls of the protruding portions P are exposed after performing the recesses R.

As shown in FIG. 17, after performing the recessing process of the insulating encapsulation 210', the protruding portions P protrude from bottom surfaces of the recesses R while the second surface S2 of the insulating encapsulation 210' is still substantially coplanar with the top surfaces of the protruding portions P. In some embodiments, a second height (h2) of each of the conductive through vias TV is greater than a third height or thickness (h3) of the insulating encapsulation 210', wherein the second height (h2) of each of conductive through vias TV may range from about 50.5 micrometers to about 310 micrometers; and the third height (h3) may range from about 50 micrometers to about 250 micrometers. In some embodiments, a roughness (h4) of the second surface S2 of the insulating encapsulation 210' is less than the first height (h1).

Referring to FIG. 18, a semiconductor device 300 including a plurality of conductive terminals 310 (e.g., lead-free solder balls) formed on a bottom surface thereof is provided above the integrated fan-out package InFO' (shown in FIG. 17), and the semiconductor device 300 is then are placed on the exposed surfaces of the conductive through vias TV. The conductive terminals 310 are, for example, reflowed to bond with and electrically connect to the exposed protruding portions P of the conductive through vias TV such that the semiconductor device 300 is electrically connected to the protruding portions P of the integrated fan-out package InFO' through the conductive terminals 310. As shown in FIG. 18, after performing the above-mentioned reflowing process, the top surfaces of the protruding portions P are covered by the reflowed conductive terminals 310 and a plurality of intermetallic compound caps 270 are formed between the reflowed conductive terminals 310 and the top surfaces of the protruding portions P. Since the top surfaces of the protruding portions P are covered by the reflowed conductive terminals 310, the intermetallic compound caps 270 are generated and cover the top surfaces of the protruding portions P.

In some alternative embodiments, when the conductive terminals 310 is reflowed, the conductive terminals 310 are slightly melt and deform to occupy some space of the recesses R. In other words, the recesses R may be partially occupied by the reflowed conductive terminals 310 and the rest space of the recesses R may be occupied by the sequentially formed underfill 400. Furthermore, the underfill 400 filled in the recesses R is in contact with the sidewalls of the protruding portions P and the protruding portions P are encapsulated and protected by the underfill 400 filled in the recesses R (shown in FIG. 18).

In some embodiments, the semiconductor device 300 stacked over the second surface S2 of the insulating encapsulation 210' is, for example, a memory device or other suitable semiconductor devices.

As shown in FIG. 17 and FIG. 18, the conductive terminals 310 may be formed on the semiconductor device 300 in advance and the intermetallic compound caps 270 are generated when the conductive terminals 310 formed on the semiconductor device 300 are pressed on and reflowed to bond with the protruding portions P. In other words, the conductive terminals 310 may be considered as parts of the semiconductor device 300. The conductive terminals 310 may be provided by other manners and the present disclosure does not limit the fabrication of the conductive terminals 310.

After the electrical bonding of the semiconductor device 300 and the integrated fan-out package InFO' is accomplished, an underfill 400 is formed between the semiconductor device 300 and the integrated fan-out package InFO' so as to encapsulate the conductive terminals 310 and the protruding portions P between the semiconductor device 300 and the integrated fan-out package InFO'. In some embodiments, since the sidewalls of the protruding portions P are not entirely covered by the reflowed conductive terminals 310, the underfill 400 is in contact with the protruding portions P of the conductive through vias TV. Delamination between the underfill 400 and conductive terminals 310 (e.g., solder) and/or delamination between the underfill 400 and the intermetallic compound 270 may be reduced by the heterogeneous interface between the underfill 400 and the protruding portion P.

Figure 19B:
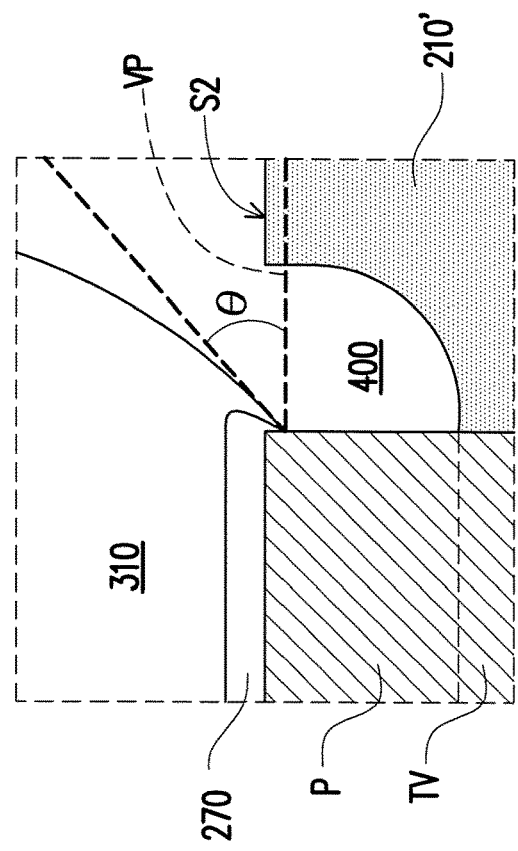
FIG. 19A and FIG. 19B schematically illustrate enlarged views of the region Y shown in FIG. 18 in accordance with various embodiments.
Figure 19A:
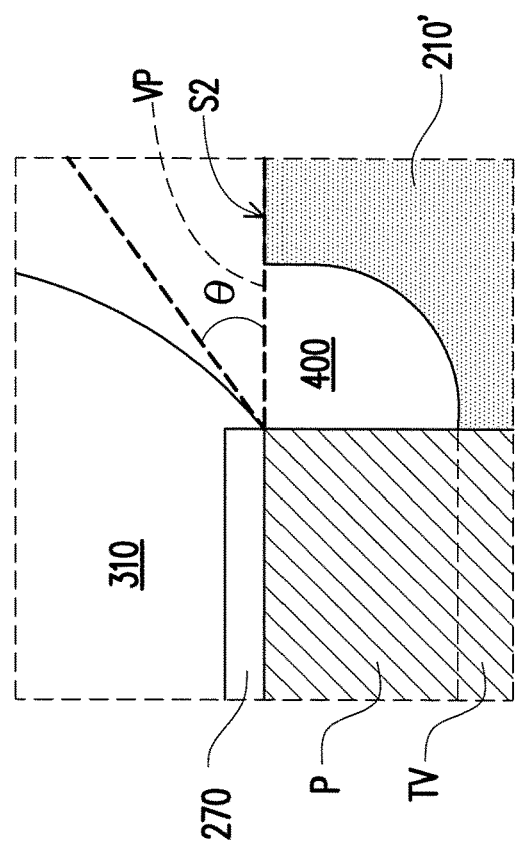

FIG. 19A and FIG. 19B schematically illustrate enlarged views of the region Y shown in FIG. 18 in accordance with various embodiments. Referring to FIG. 19A, in some embodiments, an included angle θ between lower side surfaces of the conductive terminals 310 and a virtual plane VP substantially parallel with the second surface S2 of the insulating encapsulation 210' may range from about 10 degrees to about 90 degrees. Since the sidewalls of the protruding portions P are partially exposed by the insulating encapsulation 210', the included angle θ between the lower side surfaces of the conductive terminals 310 and the virtual plane VP that is substantially parallel with the second surface S2 of the insulating encapsulation 210' is increased. Accordingly, the bonding reliability between the conductive terminals 310 and the protruding portions P is enhanced by the protruding portions P (i.e. the height difference between the top surfaces of the conductive through vias TV and the second surface S2 of the insulating encapsulation 210').

In some alternative embodiments, as shown in FIG. 19B, the reflowed conductive terminals 310 may entirely cover the top surfaces of the protruding portions P and slightly cover the sidewalls of the protruding portions P. In other words, parts of the sidewalls of the protruding portions P that are in proximity of the top surfaces of the protruding portion P are covered by the reflowed conductive terminals 310 and the rest parts of the sidewalls of the protruding portions P are not covered by the reflowed conductive terminals 310.

In accordance with some embodiments of the present disclosure, an integrated fan-out package is provided. The integrated fan-out package includes an integrated circuit component, a plurality of conductive through vias, an insulating encapsulation having a first surface and a second surface opposite to the first surface, and a redistribution circuit structure. The insulating encapsulation laterally encapsulates the conductive through vias and the integrated circuit component. Each of conductive through vias includes a protruding portion accessibly revealed by the insulating encapsulation. The redistribution circuit structure is electrically connected to the integrated circuit component and covers the first surface of the insulating encapsulation and the integrated circuit component.

In accordance with alternative embodiments of the present disclosure, a package structure including an integrated fan-out package, a semiconductor device, a plurality of conductive terminals and an underfill is provided. The integrated fan-out package includes an integrated circuit component, a plurality of conductive through vias, an insulating encapsulation having a first surface and a second surface opposite to the first surface, and a redistribution circuit structure. The insulating encapsulation laterally encapsulates the conductive through vias and the integrated circuit component. Each of conductive through vias includes a protruding portion accessibly revealed by the insulating encapsulation. The redistribution circuit structure is electrically connected to the integrated circuit component and covers the first surface of the insulating encapsulation and the integrated circuit component. The semiconductor device is stacked over the second surface of the insulating encapsulation. The conductive terminals are disposed between the semiconductor device and the protruding portions. The semiconductor device is electrically connected to the integrated fan-out package through the conductive terminals, and a plurality of intermetallic compound caps are formed between the conductive terminals and protruding portions. The underfill encapsulates the conductive terminals.

In accordance with yet alternative embodiments of the present disclosure, a method of fabricating an integrated fan-out package is provided. The method includes the following steps. An integrated circuit component and a plurality of conductive through vias are provided on a carrier; an insulating encapsulation is formed on the carrier to laterally encapsulate the integrated circuit component and the conductive through vias, wherein the insulating encapsulation has a first surface and a second surface opposite to the first surface, and the second surface is bonded with the carrier; a redistribution circuit structure is formed on the integrated circuit component and the first surface of the insulating encapsulation to form an integrated fan-out package on the carrier, and the redistribution circuit structure is electrically connected to the integrated circuit component; and the integrated fan-out package is de-bonded from the carrier; the insulating encapsulation is partially removed from the second surface to reveal protruding portions of the conductive through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
an integrated circuit component;
conductive through vias;
an insulating encapsulation having a first surface and a second surface opposite to the first surface; and
a redistribution circuit structure, the insulating encapsulation laterally encapsulating the conductive through vias and the integrated circuit component, each of the conductive through vias comprising a protruding portion protruding from the second surface of the insulating encapsulation, the redistribution circuit structure being electrically connected to the integrated circuit component and covering the first surface of the insulating encapsulation and the integrated circuit component, wherein an entirety of the second surface of the insulating encapsulation is lower than respective top surfaces of the conductive through vias and a rear surface of the integrated circuit component,
wherein the rear surface of the integrated circuit component is higher than the second surface of the insulating encapsulation and lower than respective top surfaces of the conductive through vias.

2. The integrated fan-out package of claim 1, wherein each of the protruding portions of each of the conductive through vias protrudes from the second surface of the insulating encapsulation, each of the protruding portions of each of the conductive through vias has a first height and the first height ranges from about 0.5 micrometers to about 60 micrometers.

3. The integrated fan-out package of claim 2, wherein a second height of each of the conductive through vias is greater than a third height of the insulating encapsulation, the second height of each of the conductive through vias ranges from about 50.5 micrometers to about 310 micrometers, and the third height of the insulating encapsulation ranges from about 50 micrometers to about 250 micrometers.

4. The integrated fan-out package of claim 2, wherein a roughness of the second surface of the insulating encapsulation is less than the first height.

5. The integrated fan-out package of claim 1 further comprising conductive terminals disposed on and electrically connected to the respective protruding portions of each of the conductive through vias, wherein intermetallic compound caps are formed between the conductive terminals and the respective protruding portions of each of the conductive through vias, and the intermetallic compound caps cover top surfaces of the respective protruding portions of each of the conductive through vias.

6. The integrated fan-out package of claim 1 further comprising conductive terminals disposed on and electrically connected to the respective protruding portions of each of the conductive through vias, wherein intermetallic compound caps are formed between the conductive terminals and the respective protruding portions of each of the conductive through vias, and the intermetallic compound caps cover top surfaces of the respective protruding portions of each of the conductive through vias and partially cover sidewalls of the respective protruding portions of each of the conductive through vias.

7. The integrated fan-out package of claim 1, wherein a level height difference between the second surface of the insulating encapsulation and the top surfaces of the conductive through vias ranges from about 0.5 micrometers to about 60 micrometers.

8. A package structure, comprising:
an integrated fan-out package comprising an integrated circuit component, conductive through vias, an insulating encapsulation having a first surface and a second surface opposite to the first surface, and a redistribution circuit structure, the insulating encapsulation laterally encapsulating the conductive through vias and the integrated circuit component, each of the conductive through vias comprising a protruding portion protruding from the second surface of the insulating encapsulation, the redistribution circuit structure being electrically connected to the integrated circuit component and covering the first surface of the insulating encapsulation and the integrated circuit component,
wherein a rear surface of the integrated circuit component is higher than the second surface of the insulating encapsulation and lower than respective top surfaces of the conductive through vias;
a semiconductor device stacked over the second surface of the insulating encapsulation;
conductive terminals disposed between the semiconductor device and the respective protruding portions of each of the conductive through vias, the semiconductor device being electrically connected to the integrated fan-out package through the conductive terminals, and intermetallic compound caps being formed between the conductive terminals and the respective protruding portions of each of the conductive through vias; and
an underfill encapsulating the conductive terminals.

9. The package structure of claim 8, wherein each of the protruding portions of each of the conductive through vias protrudes from the second surface of the insulating encapsulation, each of the protruding portions of each of the conductive through vias has a first height and the first height ranges from about 0.5 micrometers to about 60 micrometers.

10. The package structure of claim 9, wherein a second height of each of the conductive through vias is greater than a third height of the insulating encapsulation, the second height of each of the conductive through vias ranges from about 50.5 micrometers to about 310 micrometers, and the third height ranges from about 50 micrometers to about 250 micrometers.

11. The package structure of claim 9, wherein a roughness of the second surface of the insulating encapsulation is less than the first height.

12. The package structure of claim 8, wherein the intermetallic compound caps cover top surfaces of the respective protruding portions of each of the conductive through vias.

13. The package structure of claim 8, wherein the intermetallic compound caps cover top surfaces of the respective protruding portions of each of the conductive through vias and partially cover sidewalls of the respective protruding portions of each of the conductive through vias.

14. The package structure of claim 8, wherein the underfill is in contact with sidewalls of the respective protruding portions of each of the conductive through vias.

15. The package structure of claim 8, wherein an included angle between lower side surfaces of the conductive terminals and a virtual plane substantially parallel with the second surface of the insulating encapsulation ranges from about 10 degrees to about 90 degrees.

16. The package structure of claim 8, wherein a level height difference between the second surface of the insulating encapsulation and the top surfaces of the conductive through vias ranges from about 0.5 micrometers to about 60 micrometers.

17. A method of fabricating an integrated fan-out package, the method comprising:
providing an integrated circuit component and conductive through vias on a carrier;
forming an insulating encapsulation on the carrier to laterally encapsulate the integrated circuit component and the conductive through vias, the insulating encapsulation having a first surface and a second surface opposite to the first surface, the second surface being bonded with the carrier;
forming a redistribution circuit structure on the integrated circuit component and the first surface of the insulating encapsulation to form the integrated fan-out package on the carrier, the redistribution circuit structure being electrically connected to the integrated circuit component;
de-bonding the integrated fan-out package from the carrier; and
partially removing the insulating encapsulation from the second surface to reveal protruding portions of the conductive through vias such that an entirety of the second surface of the insulating encapsulation is lower than respective top surfaces of the conductive through vias, after partially removing the insulating encapsulation, a rear surface of the integrated circuit component is higher than the second surface of the insulating encapsulation and lower than respective top surfaces of the conductive through vias.

18. The method of claim 17, wherein providing conductive terminals on the respective protruding portions of each of the conductive through vias comprises:
stacking a semiconductor device over the integrated fan-out package, wherein the semiconductor device is electrically connected to the integrated fan-out package through the conductive terminals between the semiconductor device and the integrated fan-out package; and
forming an underfill encapsulating the conductive terminals.

19. The method of claim 17, wherein the insulating encapsulation is partially removed by an etching process and a thickness of the insulating encapsulation is reduced by the etching process to reveal the respective protruding portions of each of the conductive through vias.

20. The method of claim 17, wherein a level height difference between the second surface of the insulating encapsulation and the top surfaces of the conductive through vias ranges from about 0.5 micrometers to about 60 micrometers.

* * * * *